United States Patent
Huang et al.

(10) Patent No.: US 10,796,753 B1
(45) Date of Patent: Oct. 6, 2020

(54) METHOD AND SYSTEM TO DETERMINE QUICK PASS WRITE OPERATION IN INCREMENT STEP PULSE PROGRAMMING OPERATION

(71) Applicant: MACRONIX International Co., Ltd., Hsinchu (TW)

(72) Inventors: Yu-Hung Huang, Tainan (TW); Cheng-Hsien Cheng, Yunlin County (TW); Shaw-Hung Ku, Hsinchu (TW); Yin-Jen Chen, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/667,653

(22) Filed: Oct. 29, 2019

(51) Int. Cl.
  *G11C 11/56* (2006.01)
  *G11C 16/34* (2006.01)
  *G11C 16/10* (2006.01)
(52) U.S. Cl.
  CPC ...... *G11C 11/5628* (2013.01); *G11C 11/5671* (2013.01); *G11C 16/10* (2013.01); *G11C 16/3459* (2013.01); *G11C 2211/5621* (2013.01)
(58) Field of Classification Search
  CPC . G11C 11/5628; G11C 11/5671; G11C 16/10; G11C 16/3459; G11C 2211/5621
  See application file for complete search history.

(56) References Cited

U.S. PATENT DOCUMENTS

| | | | | |
|---|---|---|---|---|
| 8,238,164 B2* | 8/2012 | Kim | ..................... | G11C 11/5628 |
| | | | | 365/185.22 |
| 9,679,638 B2* | 6/2017 | Lee | ..................... | G11C 11/5628 |
| 2020/0075110 A1* | 3/2020 | Suzuki | ............... | G11C 16/3431 |

* cited by examiner

*Primary Examiner* — Vanthu T Nguyen
(74) *Attorney, Agent, or Firm* — J.C. Patents (57) ABSTRACT

A method for determining quick-pass-write (QPW) operation in increment-step-program-pulse (ISPP) operation is provided. The QPW operation is simultaneously applying a bit line voltage during the ISPP operation. The method includes, according to bit line voltages varying in a first range and voltage difference values varying in a second range with respect to a verified voltage, estimating a shrinkage quantity of threshold voltage distribution width at each bit line voltage and each voltage difference value, so as to obtain a shrinkage-quantity topographic contour. According to the bit line voltages and the voltage difference values, a program shot number as needed to achieve the verified voltage is estimated, so as to obtain a program-shot-number topographic contour. The shrinkage-quantity topographic contour and the program-shot-number topographic contour are overlapped to determine an operation region formed from an application range of the bit line voltage and an application range of the voltage difference value.

14 Claims, 9 Drawing Sheets

METHOD AND SYSTEM TO DETERMINE QUICK PASS WRITE OPERATION IN INCREMENT STEP PULSE PROGRAMMING OPERATION

TECHNICAL FIELD

The invention relates to a memory operation technique, and more particularly, to a method and a system for determining a quick pass write (QPW) operation in an increment step pulse programming (ISPP) operation.

BACKGROUND

In response to the widespread use of various electronic products, the flash memory is steadily growing in the market. In order to increase the memory capacity, a memory cell structure has also evolved into a memory cell that may store multiple bits, such as a multi-level-cell (MLC) memory cell, which utilizes different levels of threshold voltages of storage transistors to correspond to stored data, so as to achieve a multi-bit storage. The flash memory is, for example, the NAND type flash memory, but is not limited thereto.

Because the threshold voltages of the transistors of the memory are not completely identical, the threshold voltage at each level of these transistors is actually a distribution of one packet. When the memory cell is the MLC memory cell, multiple packets will be distributed between 0V and a program-verify (PV) voltage. If a width of the distribution of the packets is relatively large, tails of the adjacent two packets are likely to be overlapped. If the threshold voltage corresponding to read data falls in an overlapped region, data error may occur and require certain subsequent complex procedures for error correction.

If a threshold voltage packet distribution width may be reduced, it may be expected to reduce the overlapped region. This is one of the topics that need to be continuously developed in the operation of the MLC memory cell.

SUMMARY

The invention provides a method and a system for determining a quick pass write operation in an increment step pulse programming. The invention may determine a time point at which introduction of the quick pass write operation in the increment step pulse programming, wherein a bit line voltage of the quick pass write operation may also be set accordingly. In this way, an optimized operation region formed from the bit line voltage and the time point of the quick pass write operation may be estimated.

In an embodiment, the invention provides a method for determining a quick pass write operation in an increment step pulse programming. The increment step pulse programming operation is applied to a plurality of memory cells of a memory cell array first. The quick pass write operation starts to adopt a quick pass write operation after a gate voltage reaches a pre-program-verify voltage less than a program-verify voltage. A voltage difference value between the pre-program-verify voltage and the program-verify voltage is provided, and the quick pass write operation is simultaneously applying a bit line voltage during the increment step pulse programming operation. The method for determining the quick pass write operation includes according to a plurality of the bit line voltages varying in a first range and a plurality of the voltage difference values varying in a second range, estimating a shrinkage quantity of threshold voltage distribution width at the bit line voltage and the voltage difference value, so as to obtain a shrinkage-quantity topographic contour. Then, according to the bit line voltages and the voltage difference values, a program shot number as needed to achieve the verified voltage is estimated, so as to obtain a program-shot-number topographic contour. The shrinkage-quantity topographic contour and the program-shot-number topographic contour are overlapped to determine an operation region formed from an application range of the bit line voltage and an application range of the voltage difference value.

In an embodiment, with respect to the method for determining the quick pass write operation, estimating the shrinkage quantity of the threshold voltage distribution width is performed for each of the bit line voltages at a stepped voltage, and includes: at the corresponding bit line voltage and the stepped voltage, estimating a variation curve of a threshold voltage versus the gate voltage for the different voltage difference values. According to the variation curve, a slope of the program-verify voltage at the voltage difference value is estimated. The shrinkage quantity with respect to the bit line voltage being 0V is estimated according to the slope and the stepped voltage. The bit line voltage is a plurality of separation analysis values from 0V to a predetermined value.

In an embodiment, with respect to the method for determining the quick pass write operation, the shrinkage quantity includes estimating a product of the slope times the stepped voltage.

In an embodiment, with respect to the method for determining the quick pass write operation, the bit line voltage of the operation region is included between 0.22V and 0.3V and the voltage difference value is between 0.1V and 0.14.

In an embodiment, with respect to the method for determining the quick pass write operation, the operation region includes a triangle, and a bottom of the triangle is a range of the bit line voltage.

In an embodiment, with respect to the method for determining the quick pass write operation, the shrinkage-quantity topographic contour determines a first selected region according to a height of the bit line voltage, the program-shot-number topographic contour determines a second selected region according to a height of the program shot number, and at least a portion of an overlapped region of the first selected region and the second selected region is set as the operation region.

In an embodiment, with respect to the method for determining the quick pass write operation, estimating the shrinkage quantity of threshold voltage distribution includes performing a model comparison with experimental data according to the bit line voltage, the voltage difference value and the stepped voltage of a predetermined sample, so as to ensure a correctness of a model.

In an embodiment, the invention further provides a system for determining a quick pass write operation in an increment step pulse programming. The increment step pulse programming operation is applied to a plurality of memory cells of a memory cell array first. The quick pass write operation starts to adopt a quick pass write operation after a gate voltage reaches a pre-program-verify voltage less than a program-verify voltage. A voltage difference value between the pre-program-verify voltage and the program-verify voltage is provided. The quick pass write operation is simultaneously applying a bit line voltage during the increment step pulse programming operation. The system for determining the quick pass write operation includes an analysis circuit and an analysis program storage unit. The analysis circuit is configured to obtain an analysis program from the analysis program storage unit for operating the memory cell array to execute the following steps, including according to a plurality of the bit line voltages varying in a first range and a plurality of the voltage difference values varying in a second range, estimating a shrinkage quantity of threshold voltage distribution width at the bit line voltage and the voltage difference value, so as to obtain a shrinkage-quantity topographic contour. According to the bit line voltages and the voltage difference values, a program shot number as needed to achieve the verified voltage is estimated, so as to obtain a program-shot-number topographic contour. The shrinkage-quantity topographic contour and the program-shot-number topographic contour are overlapped to determine an operation region formed from an application range of the bit line voltage and an application range of the voltage difference value.

In an embodiment, with respect to the system for determining the quick pass write operation, estimating the shrinkage quantity of the threshold voltage distribution width is performed for each of the bit line voltages at a stepped voltage, and includes: at the corresponding bit line voltage and the stepped voltage, estimating a variation curve of a threshold voltage versus the gate voltage for the different voltage difference values. According to the variation curve, a slope of the program-verify voltage at the voltage difference value is estimated. The shrinkage quantity with respect to the bit line voltage being 0V is estimated according to the slope and the stepped voltage. The bit line voltage is a plurality of separation analysis values from 0V to a predetermined value.

In an embodiment, with respect to the system for determining the quick pass write operation, the shrinkage quantity includes estimating a product of the slope times the stepped voltage.

In an embodiment, with respect to the system for determining the quick pass write operation, the bit line voltage of the operation region is included between 0.22V and 0.3V and the voltage difference value is between 0.1V and 0.14.

In an embodiment, with respect to the system for determining the quick pass write operation, the operation region includes a triangle, and a bottom of the triangle is a range of the bit line voltage.

In an embodiment, with respect to the system for determining the quick pass write operation, the shrinkage-quantity topographic contour determines a first selected region according to a height of the bit line voltage. The program-shot-number topographic contour determines a second selected region according to a height of the program shot number. At least a portion of an overlapped region of the first selected region and the second selected region is set as the operation region.

In an embodiment, with respect to the system for determining the quick pass write operation, estimating the shrinkage quantity of threshold voltage distribution includes performing a model comparison with experimental data according to the bit line voltage, the voltage difference value and the stepped voltage of a predetermined sample, so as to ensure a correctness of a model.

To make the aforementioned more comprehensible, several embodiments accompanied with drawings are described in detail as follows.

DETAILED DESCRIPTION

The invention proposes a time point at which introduction of the quick pass write operation may be determined in the increment step pulse programming, wherein a bit line voltage of the QPW operation may also be set accordingly. In this way, an optimized operation region formed from the bit line voltage and the time point of the QPW operation may be estimated. According to a model established by the invention for a shrinkage-quantity topographic contour and a program-shot-number topographic contour, after a cross comparison is performed, the timing for introducing the QPW operation and an applicable range of the bit line voltage may be determined.

Several embodiments are provided below to describe the invention, but the invention is not limited by the provided embodiments.

Figure 1:
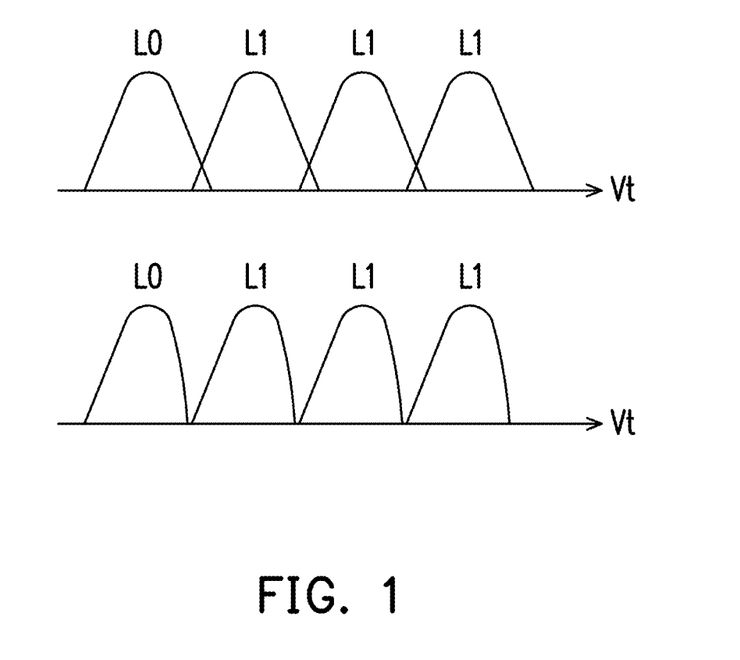
FIG. 1 is a schematic diagram of a threshold voltage distribution of multiple levels corresponding to a plurality of MLC memory cells in a memory device according to an embodiment of the invention.

FIG. 1 is a schematic diagram of a threshold voltage distribution of multiple levels corresponding to a plurality of MLC memory cells in a memory device according to an embodiment of the invention. Referring to FIG. 1, a threshold voltage distribution on an upper portion refers to the most likely scenario. For example, in a two-bit memory cell, there are four threshold voltages for four storage states. Tail regions corresponding to the threshold voltage distributions of various levels may be overlapped. For example, when a threshold voltage value read from a memory cell that falls in an overlapped region, a packet to which it belongs will be hard to determine. Worth yet, data error may occur and require subsequent complex procedures for error correction.

Continuing to refer to a lower portion of FIG. 1, if a threshold voltage distribution width may be appropriately shrunk, the threshold voltages of various levels may be clearly distinguished to reduce the probability of data error. In the invention, by properly introducing the QPW operation in the ISPP operation, a tail edge of a threshold voltage packet distribution may be retracted so as to at least reduce the overlapped region with the next packet.

Before a mode of the QPW operation is estimated, the invention firstly investigates and verifies variations in certain operating parameters corresponding to the ISPP operation and the QPW operation so then conditions for determining the QPW operation may be determined.

Figure 2:
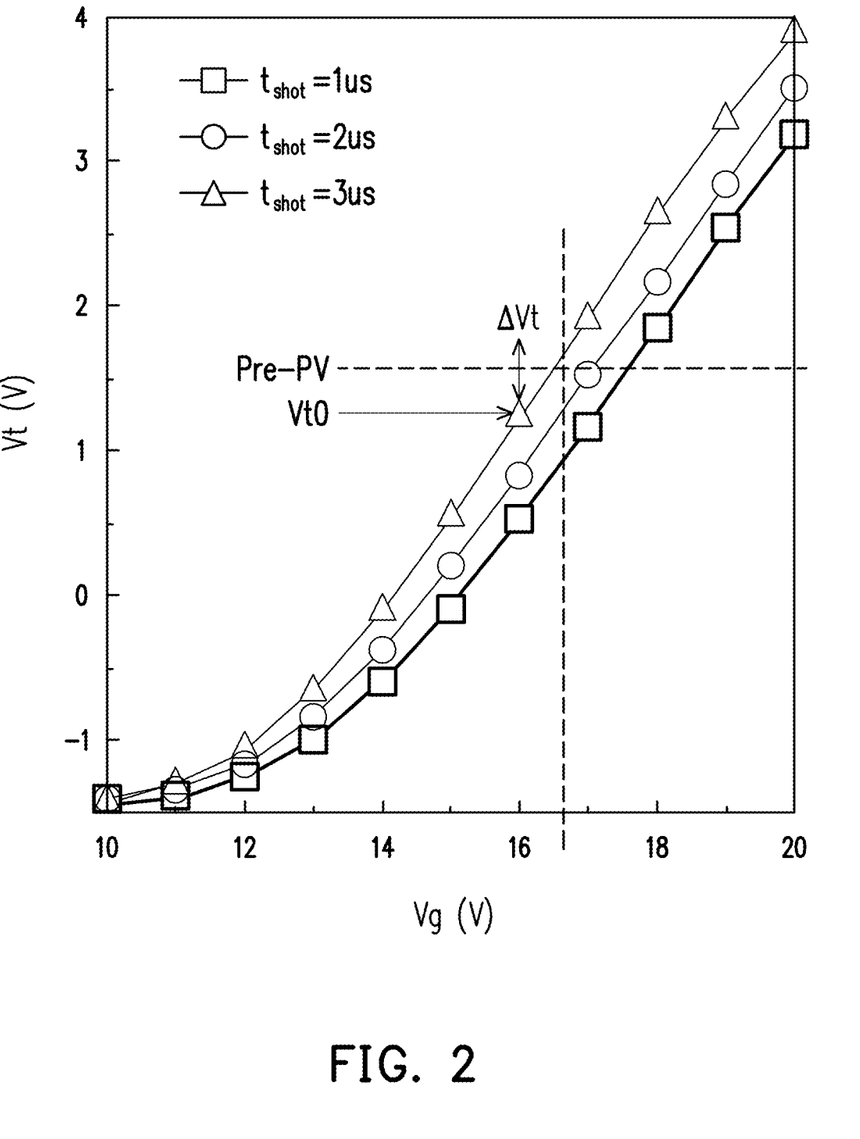
FIG. 2 is a schematic diagram of a variation curve of a threshold voltage (Vt) versus a gate voltage (Vg) of a memory cell measured according to an embodiment of the invention.

FIG. 2 is a schematic diagram of a variation curve of a threshold voltage (Vt) versus a gate voltage (Vg) of a memory cell measured according to an embodiment of the invention. Referring to FIG. 2, an actual measurement of the threshold voltage is performed on memory cells of a memory cell array. A gate voltage (Vg) is applied to a gate of a memory transistor. The gate voltage (Vg) varies, for example, from 10V to 20V. A waveform of the gate voltage (Vg) is a pulse. A pulse time width is exemplified by, for example, 1 microsecond, 2 microseconds, and 3 microseconds. In the ISPP operation, the threshold voltage varying with the gate voltage (Vg) may be measured.

Figure 3:
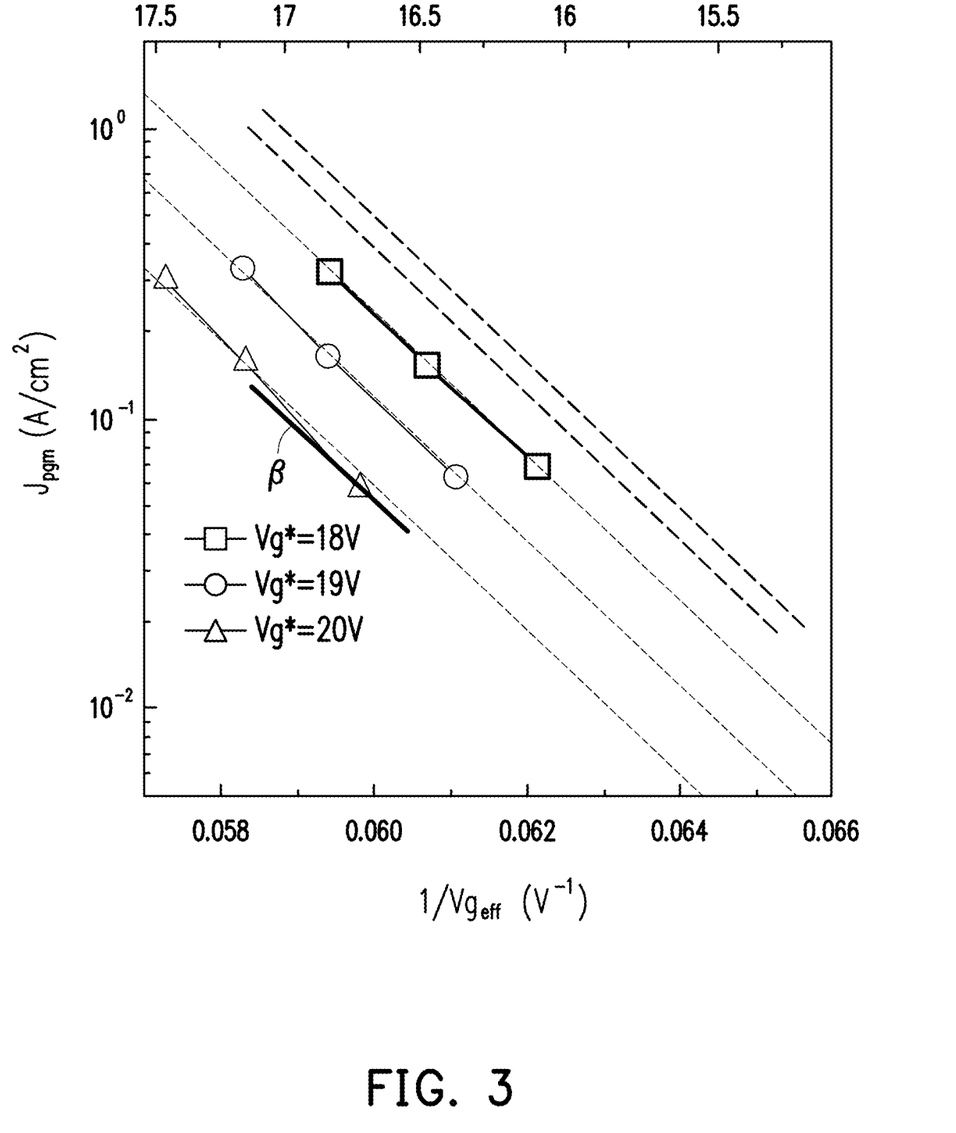
FIG. 3 is a schematic diagram of a variation curve of an effective current density ($J_{pgm}$) versus a reciprocal of an effective gate voltage ($Vg_{eff}$) converted based on data of FIG. 2 according to an embodiment of the invention.

FIG. 3 is a schematic diagram of a variation curve of an effective current density ($J_{pgm}$) versus a reciprocal of an effective gate voltage ($Vg_{eff}$) converted based on data of FIG. 2 according to an embodiment of the invention. With reference to FIG. 3, based on data of FIG. 2, a variation of the effective current density ($J_{pgm}$) versus the reciprocal of the effective gate voltage ($Vg_{eff}$) may be obtained through the conversion of Equation (1) and Equation (2) below, and may be used to verify that their relationship is a linear relationship having a slope of β. Accordingly, it may be ensured that the gate voltage (Vg) of FIG. 2 may be used to obtain a current density.

$$Vg_{eff} = Vg - V_{BL} - Vt = Vg^* - Vt \qquad (1)$$

$$J_{pgm} = C_{pp} \times \Delta Vt / t_{pgm} \qquad (2)$$

wherein $V_{BL}$ is the bit line voltage; Cpp is a capacitance constant; $t_{pgm}$ is a pulse width.

According to the verification of FIG. 3, during the ISPP operation, if the bit line voltage ($V_{BL}$) is simultaneously applied, the current density thereof may be predicted in the ISPP operation. The gate voltage (Vg) in the ISPP operation is gradually increasing in pulse height by a stepping manner. In this case, if the bit line voltage ($V_{BL}$) is 0V, the operation is a normal ISPP operation. The QPW operation refers to simultaneously applying the bit line voltage ($V_{BL}$) during the ISPP operation to increase a voltage on a channel so that a write-in electric field intensity is weakened. Accordingly, as a programming speed becomes slower, it is expected that the threshold voltage distribution width will be shrunk.

Hereinafter, according to a relationship of Equation (1) and Equation (2), a behavior of the threshold voltage is further predicted in the ISPP operation together with the bit line voltage ($V_{BL}$). Equation (3) to Equation (5) may be added to the ISPP operation and the QPW operation (depending on a value of the bit line voltage ($V_{BL}$)) to estimate a voltage difference value ($\Delta Vt\_i$) corresponding to a program shot number (i) in the ISPP operation.

$$Vg_{eff\_i} = Vg_{eff\_0} + i \times V_{ISPP} - V_{BL} - \sum_{i=1}^{n} \Delta V_{t\_i-1} \qquad (3)$$

$$J_{pgm\_i-1} \times \mathrm{Exp}\left[\beta \times \left(\frac{1}{Vg_{eff_i}(Vg^*)} - \frac{1}{Vg_{eff_{i-1}}(Vg^*)}\right)\right] \qquad (4)$$

$$\Delta Vt\_i = J_{pgm\_i} \times t_{pgm} / C_{pp} \qquad (5)$$

Figure 4:
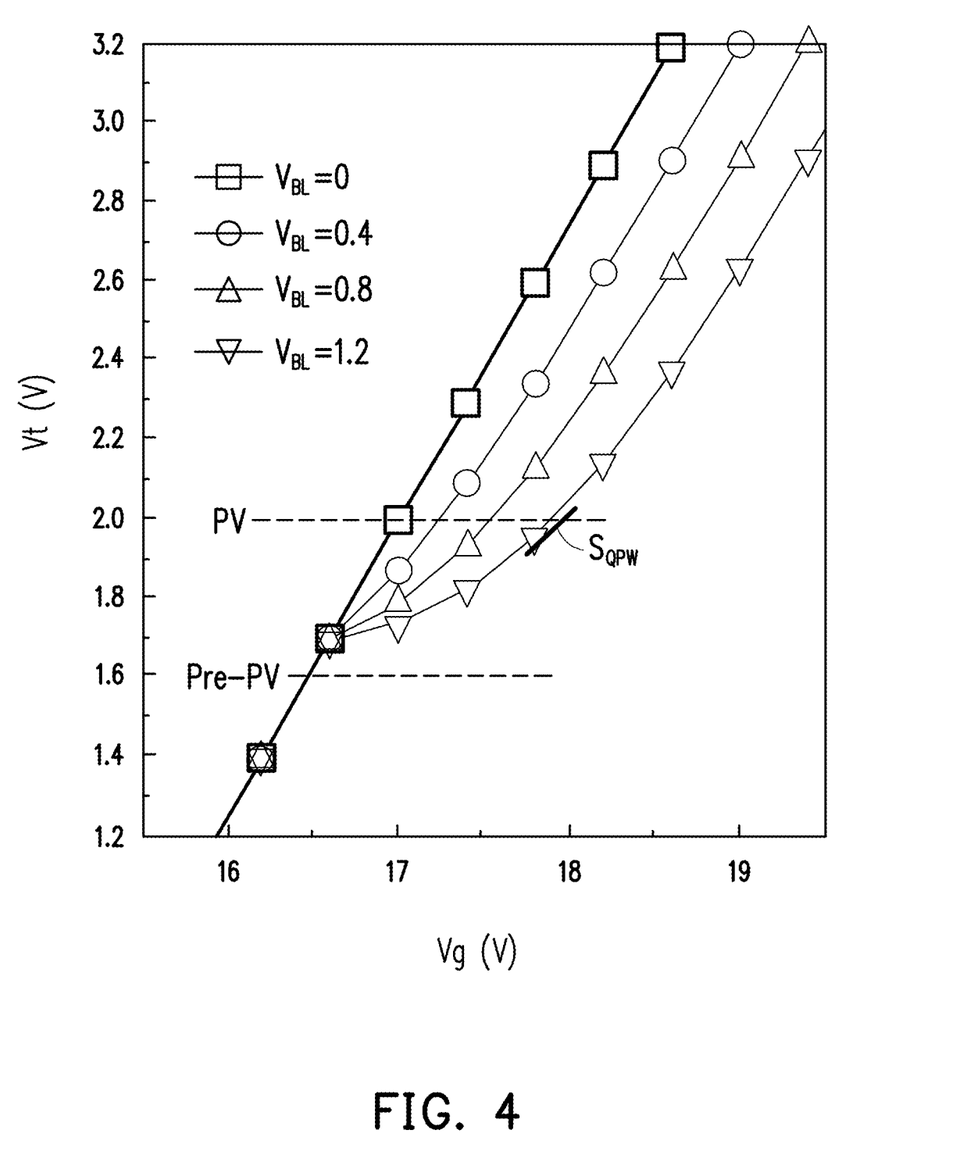
FIG. 4 is a schematic diagram of a mechanism for performing the ISPP operation together with the QPW operation in a linear region of Vt versus Vg according to an embodiment of the invention.

FIG. 4 is a schematic diagram of a mechanism for performing the ISPP operation together with the QPW operation in a linear region of Vt versus Vg according to an embodiment of the invention. Referring to FIG. 4, a linear region of FIG. 2 (i.e., a range in which the gate voltage (Vg) is greater than 16V) is extracted. In the ISPP operation, the gate voltage (Vg) is increased in the stepping manner. If $V_{BL}=0$, the entire process is the ISPP operation. When the QPW operation is to be performed, in this embodiment, for a target value of a program-verify voltage (PV), a voltage value to be initially added to the QPW operation (a.k.a. a pre-program-verify voltage ($V_{pre-PV}$)), which has the voltage difference value (ΔPV) with respect to the target program-verify voltage ($V_{PV}$) needs to be selected. The voltage difference value (ΔPV) is defined as:

$$\Delta PV = V_{PV} - V_{pre-PV} \qquad (6)$$

After a pulse programming of the gate voltage reaches the pre-program-verify voltage (pre-PV), the bit line voltage ($V_{BL}$) is then applied. Once the bit line voltage ($V_{BL}$) applied is not zero, a QPW operation mode is then entered, in which the threshold voltage (Vt) is deflected (i.e., the slope thereof will drop) due to the bit line voltage ($V_{BL}$). When the gate voltage (Vg) reaches the program-verify voltage (PV), a slope ($S_{QPW}$) of the threshold voltage (Vt) versus the gate voltage (Vg) will therefore also vary together with the value of the bit line voltage ($V_{BL}$). With the bit line voltage ($V_{BL}$) of FIG. 4 exemplified by 0V, 0.4V, 0.8V and 1.2V, effects generated by the QPW operation may be observed.

Figure 5:
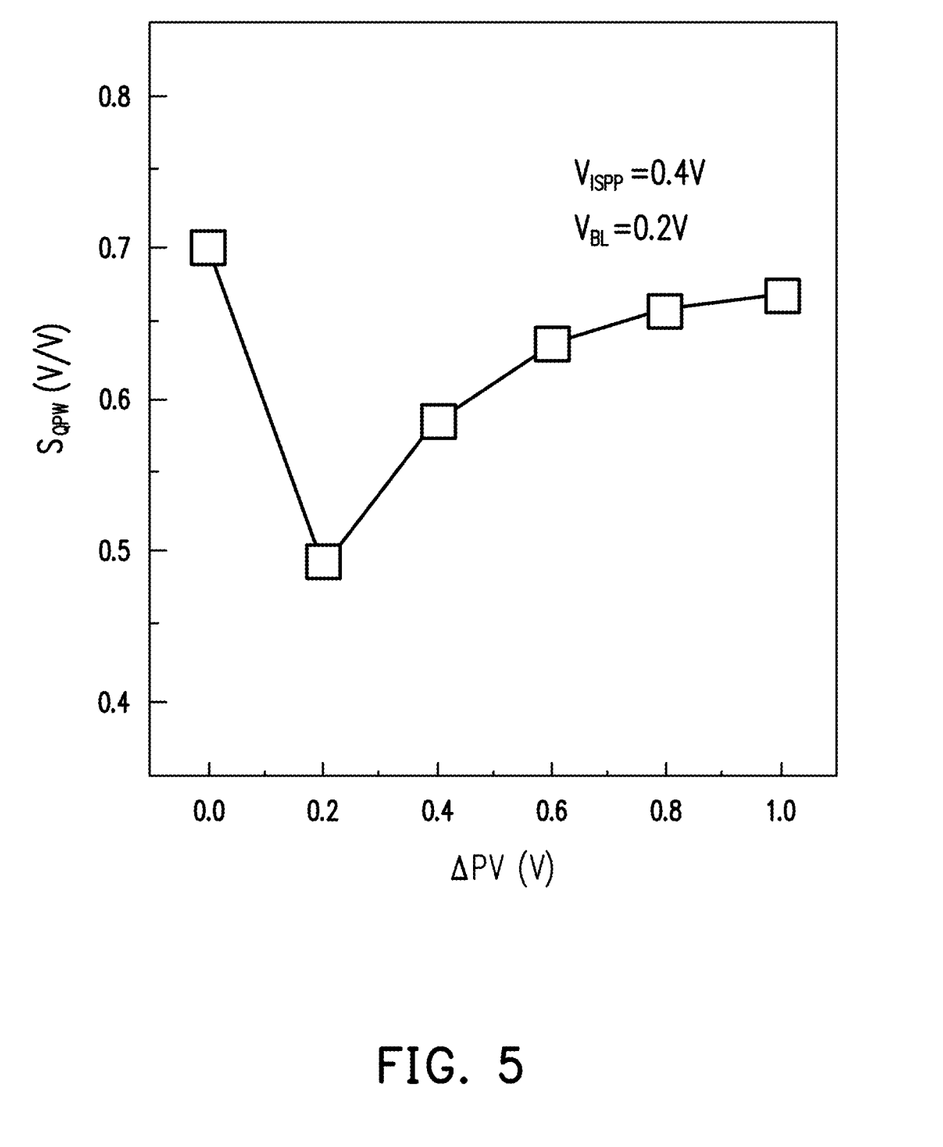
FIG. 5 is a schematic diagram of a curve slope at a program-verify voltage based on the curve of FIG. 2 in accordance with a voltage difference value (ΔPV) varying from a pre-program-verify voltage to the program-verify voltage according to an embodiment of the invention.

FIG. 5 is a schematic diagram of a curve slope at a program-verify voltage based on the curve of FIG. 2 in accordance with a voltage difference value (ΔPV) varying from a pre-program-verify voltage to the program-verify voltage according to an embodiment of the invention. Referring to FIG. 5, according to the behavior of the slope ($S_{QPW}$) varying in the QPW operation, for each bit line voltage ($V_{BL}$), a variation curve of the slope ($S_{QPW}$) versus the voltage difference value (ΔPV) may be simulated. FIG. 5 is, for example, a case where $V_{BL}=0.2V$ and the stepped voltage of the gate voltage corresponding to ISPP is 0.4V. Similarly, other conditions (e.g., the different bit line voltages ($V_{BL}$)) also have corresponding slope curves. The voltage difference (ΔPV) at the lowest point of the slope is a voltage value corresponding to entering the QPW operation. Because the program-verify voltage (PV) is a fixed value, the voltage difference value (ΔPV) is corresponding to the pre-program-verify voltage (pre-PV). The pre-program-verify voltage (pre-PV) is a reference value that determines whether to enter the OPW operation or not. According to a product of the slope ($S_{QPW}$) times the stepped voltage, a shrinkage quantity of the threshold voltage distribution width may be estimated, for example. Here, the behavior of FIG. 5 is a result simulated by a model according to the invention, which may facilitate a quick analysis started by the system.

Nonetheless, the invention also needs to confirm a correctness of the model by experimental data.

Figure 6:
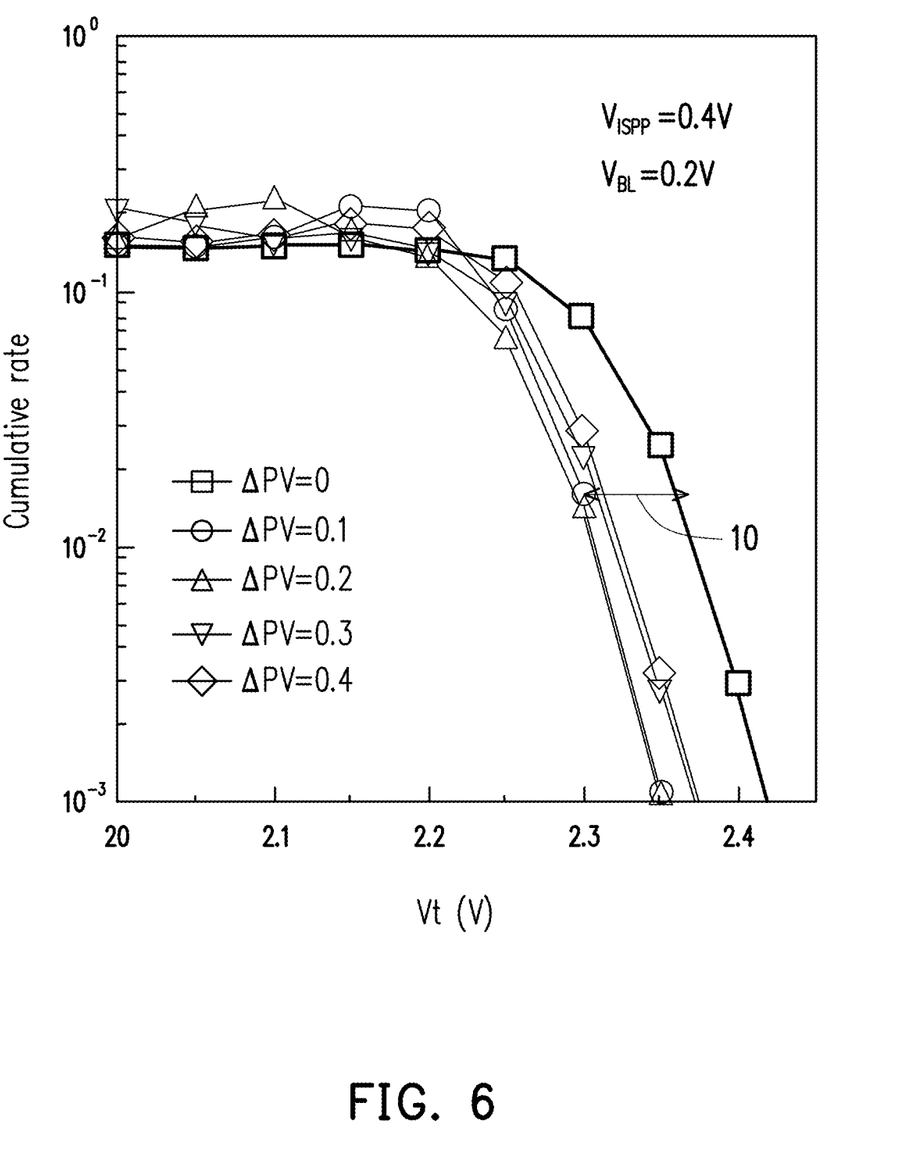
FIG. 6 is a schematic diagram of a cumulative rate of memory cells in an actual measurement in accordance with the voltage difference value (ΔPV) varying from the pre-program-verify voltage to the program-verify voltage according to an embodiment of the invention.

FIG. 6 is a schematic diagram of a cumulative rate of memory cells in an actual measurement in accordance with the voltage difference value (ΔPV) varying from the pre-program-verify voltage to the program-verify voltage according to an embodiment of the invention. Referring to FIG. 6, by applying the bit line voltage ($V_{BL}$) and a stepped voltage ($V_{ISPP}$), the threshold voltages Vt of the memory cells are measured and counted. Here, for example, $V_{BL}$=0.2V, $V_{ISPP}$=0.4V and the voltage difference value (ΔPV) is a variation in a plurality of values. A square dot represents $V_{BL}$=0V (i.e., when the QPW operation is not applied), and is used as the reference value. When the QPW operation is applied, the threshold voltage Vt will be retracted so a measured shrinkage quantity 10 may be estimated.

Figure 7:
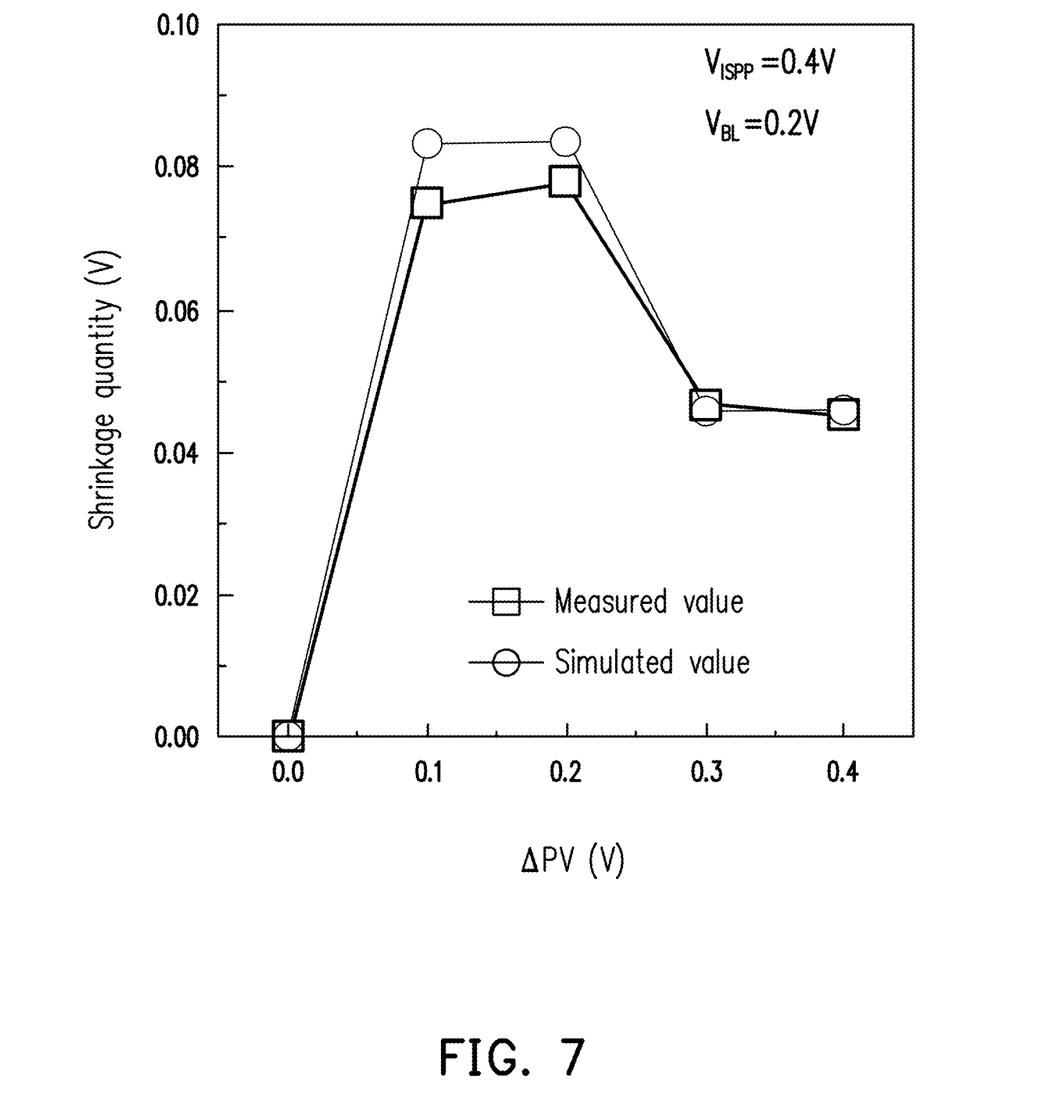
FIG. 7 is a schematic diagram of a comparison of simulated data and measured data of a shrinkage quantity of a threshold voltage packet distribution width in accordance with the voltage difference value (ΔPV) varying from the pre-program-verify voltage to the program-verify voltage according to an embodiment of the invention.

FIG. 7 is a schematic diagram of a comparison of simulated data and measured data of a shrinkage quantity of a threshold voltage packet distribution width in accordance with the voltage difference value (ΔPV) varying from the pre-program-verify voltage to the program-verify voltage according to an embodiment of the invention. Referring to FIG. 7, the shrinkage quantity of the threshold voltage packet distribution width estimated through the simulation based on FIG. 5 is represented by a circular dot. The shrinkage quantity 10 of the threshold voltage packet distribution width estimated through the measurement based on FIG. 6 is represented by a square dot. The results of the simulation and the measurement may be considered to be consistent to a certain extent. As such, the simulated model of the invention may reasonably reflect the shrinkage quantity of the threshold voltage packet distribution width.

Figure 8:
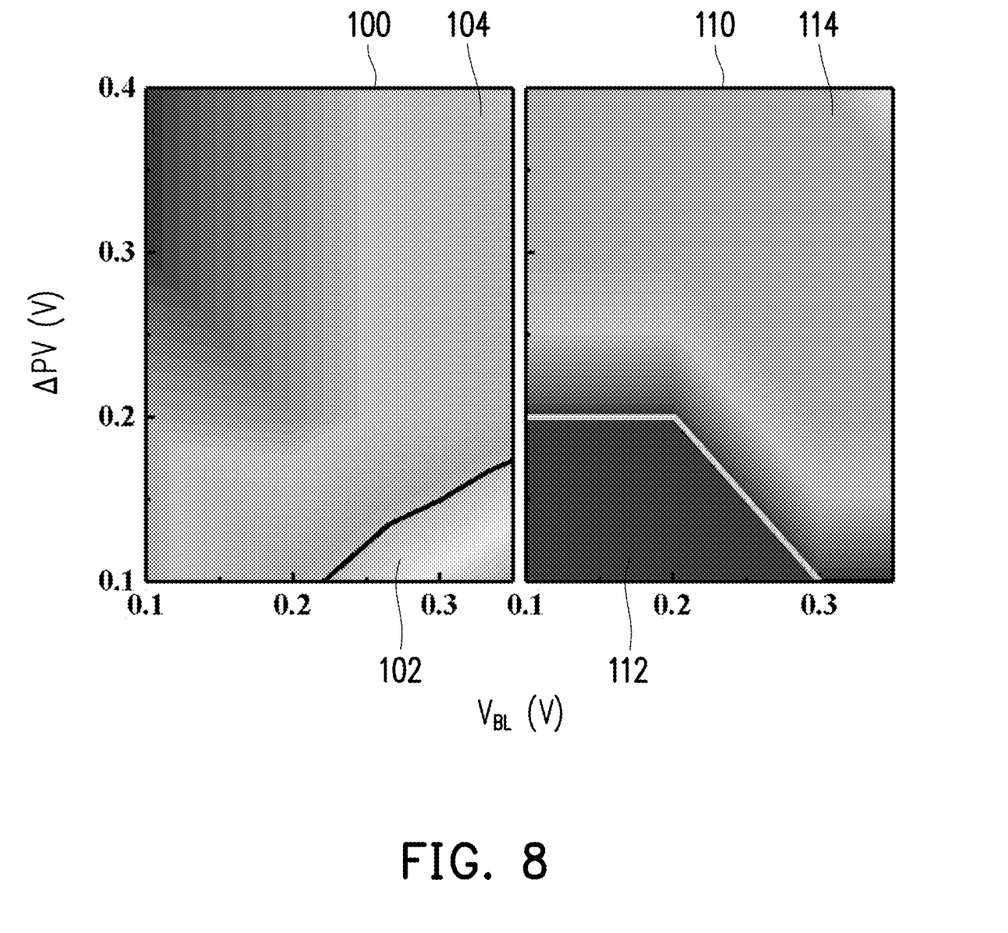
FIG. 8 is a schematic diagram of a shrinkage-quantity topographic contour and a program-shot-number topographic contour according to an embodiment of the invention.

FIG. 8 is a schematic diagram of a shrinkage-quantity topographic contour and a program-shot-number topographic contour according to an embodiment of the invention. Referring to FIG. 8, according to a plurality of bit line voltages ($V_{BL}$) varying in a range (e.g., from 0.1V to 0.35V) and a plurality of voltage difference values (ΔPV) varying in a range (e.g., from 0.1V to 0.4V) based on FIG. 5, the shrinkage quantity of the threshold voltage distribution width at the bit line voltage ($V_{BL}$) and the voltage difference value (ΔPV) is estimated to obtain a shrinkage-quantity topographic contour 100. The shrinkage-quantity is a height of the topographic contour represented by, for example, gray scale. A region 102 desired and a region 104 other than that may be distinguished and selected from the shrinkage-quantity topographic contour 100 based on the height of the shrinkage quantity.

In addition, similarly, according to a map of the bit line voltages ($V_{BL}$) and the voltage difference values (ΔPV), a program shot number (its height is counted) as needed to achieve the program-verify voltage ($V_{PV}$) by applying the increment step pulse programming (ISPP) operation is estimated to obtain a program-shot-number topographic contour 110. A region 112 acceptable and a region 114 other than that are also determined based on the consideration of operating time cost.

It may be noted here that, since the correctness of the model of the invention has been confirmed, data of FIG. 8 may be extensively simulated according to the model to facilitate estimation, which does not require the actual measurement, or requires only a simple measurement confirmation.

Figure 9:
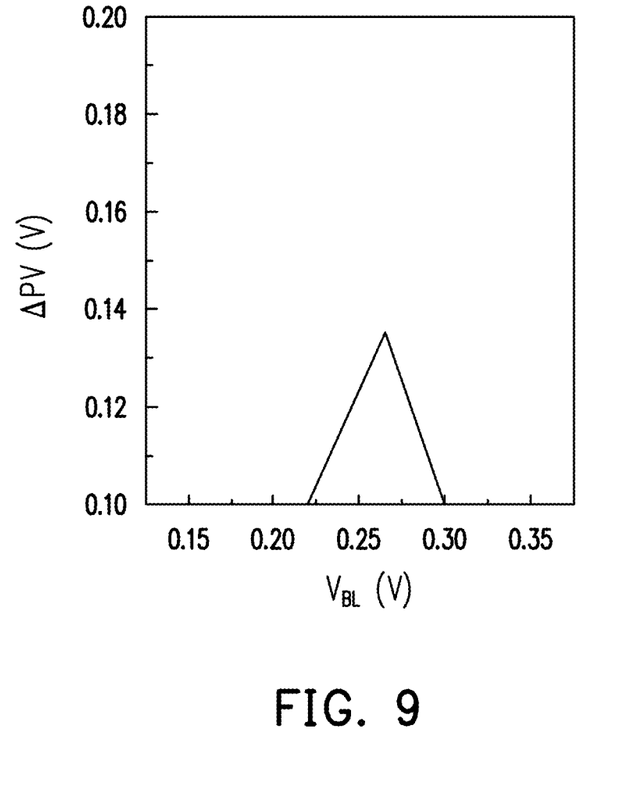
FIG. 9 is a schematic diagram of an operation region of the QPW operation determined after the shrinkage-quantity topographic contour and the program-shot-number topographic contour are overlapped according to an embodiment of the invention.

FIG. 9 is a schematic diagram of an operation region of the QPW operation determined after the shrinkage-quantity topographic contour and the program-shot-number topographic contour are overlapped according to an embodiment of the invention. Referring to FIG. 9, the shrinkage-quantity topographic contour 100 and the program-shot-number topographic contour 110 of FIG. 8 are overlapped so that an operation region formed from an application range of the bit line voltage ($V_{BL}$) and an application range of the voltage difference value (ΔPV) may be determined by an overlapped region of the region 102 and the region 112. The obtained operation region may be different due to different types of memory cell structures, but the estimated mechanism is similar.

From the result of FIG. 9, the invention may make an optimization for estimating the bit line voltage ($V_{BL}$) and the voltage difference value (ΔPV), shrink the threshold voltage distribution width and maintain a reasonable operating time.

Figure 10:
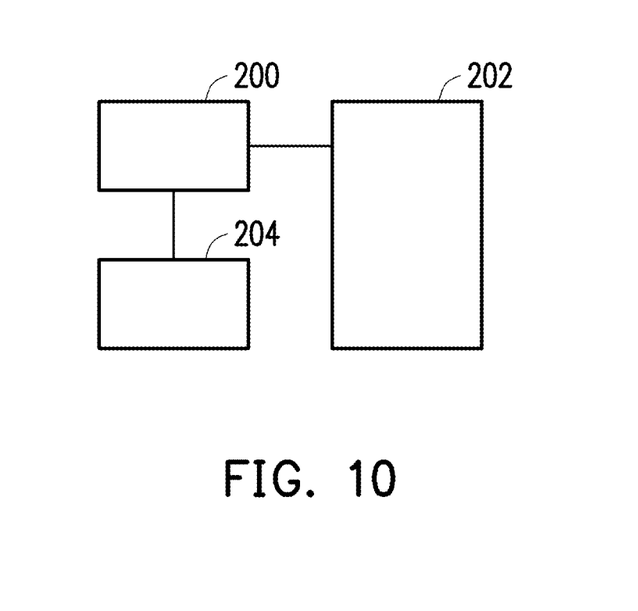
FIG. 10 is a schematic diagram of architecture of a system for determining a quick pass write operation according to an embodiment of the invention.

From the perspective of the hardware system, FIG. 10 is a schematic diagram of architecture of a system for determining a quick pass write operation according to an embodiment of the invention. Referring to FIG. 10, the system for determining the quick pass write operation includes, for example, an analysis circuit 200 and an analysis program storage unit 204. Here, the analysis circuit 200 is configured to obtain an analysis program from the analysis program storage unit 204 for operating a memory cell array 202 to execute aforementioned steps for obtaining the shrinkage-quantity topographic contour 100 and the program-shot-number topographic contour 110.

Specifically, the system for determining the quick pass write operation is configured to executing a plurality of steps, including according to a plurality of the bit line voltages varying in a first range and a plurality of the voltage difference values varying in a second range, estimating a shrinkage quantity of threshold voltage distribution width at the bit line voltage and the voltage difference value, so as to obtain a shrinkage-quantity topographic contour. According to the bit line voltages and the voltage difference values, a program shot number as needed to achieve the verified voltage is estimated, so as to obtain a program-shot-number topographic contour. The shrinkage-quantity topographic contour and the program-shot-number topographic contour are overlapped to determine an operation region formed from an application range of the bit line voltage and an application range of the voltage difference value.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

The invention claimed is:

1. A method for determining a quick pass write operation in an increment step pulse programming operation, the increment step pulse programming operation being applied to a plurality of memory cells of a memory cell array first, the quick pass write operation starting to adopt a quick pass write operation after a gate voltage reaches a pre-program-verify voltage less than a program-verify voltage, wherein a voltage difference value between the pre-program-verify voltage and the program-verify voltage is provided, the quick pass write operation is simultaneously applying a bit line voltage during the increment step pulse programming operation, and the method for determining the quick pass write operation comprises:

according to a plurality of the bit line voltages varying in a first range and a plurality of the voltage difference values varying in a second range, estimating a shrinkage quantity of threshold voltage distribution width at the bit line voltage and the voltage difference value, so as to obtain a shrinkage-quantity topographic contour;

according to the bit line voltages and the voltage difference values, estimating a program shot number as needed to achieve the program-verify voltage by applying the increment step pulse programming operation, so as to obtain a program-shot-number topographic contour; and after the shrinkage-quantity topographic contour and the program-shot-number topographic contour are overlapped, determining an operation region formed from an application range of the bit line voltage and an application range of the voltage difference value.

2. The method for determining the quick pass write operation of claim 1, wherein estimating the shrinkage quantity of the threshold voltage distribution width is performed for each of the bit line voltages at a stepped voltage, and comprising:

at the corresponding bit line voltage and the stepped voltage, estimating a variation curve of a threshold voltage versus the gate voltage for the different voltage difference values;

according to the variation curve, estimating a slope of the program-verify voltage at the voltage difference value; and estimating the shrinkage quantity with respect to the bit line voltage being 0V according to the slope and the stepped voltage, wherein the bit line voltage is a plurality of separation analysis values from 0V to a predetermined value.

3. The method for determining the quick pass write operation of claim 2, wherein the shrinkage quantity comprises estimating a product of the slope times the stepped voltage.

4. The method for determining the quick pass write operation of claim 1, wherein the bit line voltage of the operation region is included between 0.22V and 0.3V and the voltage difference value is between 0.1V and 0.14.

5. The method for determining the quick pass write operation of claim 1, wherein the operation region comprises a triangle, and a bottom of the triangle is a range of the bit line voltage.

6. The method for determining the quick pass write operation of claim 1, wherein the shrinkage-quantity topographic contour determines a first selected region according to a height of the bit line voltage, the program-shot-number topographic contour determines a second selected region according to a height of the program shot number, and at least a portion of an overlapped region of the first selected region and the second selected region is set as the operation region.

7. The method for determining the quick pass write operation of claim 1, wherein estimating the shrinkage quantity of threshold voltage distribution comprises performing a model comparison with experimental data according to the bit line voltage, the voltage difference value and the stepped voltage of a predetermined sample, so as to ensure a correctness of a model.

8. A system for determining a quick pass write operation in an increment step pulse programming operation, the increment step pulse programming operation being applied to a plurality of memory cells of a memory cell array first, the quick pass write operation starting to adopt a quick pass write operation after a gate voltage reaches a pre-program-verify voltage less than a program-verify voltage, wherein a voltage difference value between the pre-program-verify voltage and the program-verify voltage is provided, and the quick pass write operation is simultaneously applying a bit line voltage during the increment step pulse programming operation, the system for determining the quick pass write operation comprises an analysis circuit and an analysis program storage unit, wherein the analysis circuit is configured to obtain an analysis program from the analysis program storage unit for operating the memory cell array to execute the following steps:

according to a plurality of the bit line voltages varying in a first range and a plurality of the voltage difference values varying in a second range, estimating a shrinkage quantity of threshold voltage distribution width at the bit line voltage and the voltage difference value, so as to obtain a shrinkage-quantity topographic contour;

according to the bit line voltages and the voltage difference values, estimating a program shot number as needed to achieve the program-verify voltage by applying the increment step pulse programming operation, so as to obtain a program-shot-number topographic contour; and after the shrinkage-quantity topographic contour and the program-shot-number topographic contour are overlapped, determining an operation region formed from an application range of the bit line voltage and an application range of the voltage difference value.

9. The system for determining the quick pass write operation of claim 8, wherein estimating the shrinkage quantity of the threshold voltage distribution width is performed for each of the bit line voltages at a stepped voltage, and comprises:

at the corresponding bit line voltage and the stepped voltage, estimating a variation curve of a threshold voltage versus the gate voltage for the different voltage difference values;

according to the variation curve, estimating a slope of the program-verify voltage at the voltage difference value; and estimating the shrinkage quantity with respect to the bit line voltage being 0V according to the slope and the stepped voltage, wherein the bit line voltage is a plurality of separation analysis values from 0V to a predetermined value.

10. The system for determining the quick pass write operation of claim 9, wherein the shrinkage quantity comprises estimating a product of the slope times the stepped voltage.

11. The system for determining the quick pass write operation of claim 8, wherein the bit line voltage of the operation region is included between 0.22V and 0.3V and the voltage difference value is between 0.1V and 0.14.

12. The system for determining the quick pass write operation of claim 8, wherein the operation region comprises a triangle, and a bottom of the triangle is a range of the bit line voltage.

13. The system for determining the quick pass write operation of claim 8, wherein the shrinkage-quantity topographic contour determines a first selected region according to a height of the bit line voltage, the program-shot-number topographic contour determines a second selected region according to a height of the program shot number, and at least a portion of an overlapped region of the first selected region and the second selected region is set as the operation region.

14. The system for determining the quick pass write operation of claim 8, wherein estimating the shrinkage quantity of threshold voltage distribution comprises performing a model comparison with experimental data according to the bit line voltage, the voltage difference value and the stepped voltage of a predetermined sample, so as to ensure a correctness of a model.

\* \* \* \* \*